United States Patent
Tang et al.

(10) Patent No.: US 10,937,993 B2
(45) Date of Patent: Mar. 2, 2021

(54) ORGANIC LIGHT-EMITTING DIODE DISPLAY PANEL HAVING UNDER-THE-SCREEN STRUCTURE AND DISPLAY DEVICE THEREOF

(71) Applicant: WUHAN CHINA STAR OPTOELECTRONICS SEMICONDUCTOR DISPLAY TECHNOLOGY CO., LTD., Hubei (CN)

(72) Inventors: Rui Tang, Hubei (CN); Wenzhi Zhang, Hubei (CN)

(73) Assignee: WUHAN CHINA STAR OPTOELECTRONICS SEMICONDUCTOR DISPLAY CO., LTD., Wuhan (CN)

(*) Notice: Subject to any disclaimer, the term of this patent is extended or adjusted under 35 U.S.C. 154(b) by 3 days.

(21) Appl. No.: 16/472,997

(22) PCT Filed: Apr. 1, 2019

(86) PCT No.: PCT/CN2019/080842
§ 371 (c)(1),
(2) Date: Jun. 24, 2019

(87) PCT Pub. No.: WO2020/133779
PCT Pub. Date: Jul. 2, 2020

(65) Prior Publication Data
US 2020/0212368 A1    Jul. 2, 2020

(30) Foreign Application Priority Data

Dec. 28, 2018  (CN) .................. 201811628651.X (51) Int. Cl.
*H01L 29/08*  (2006.01)
*H01L 51/52*  (2006.01)
*H01L 27/32*  (2006.01)

(52) U.S. Cl.
CPC ...... *H01L 51/5281* (2013.01); *H01L 27/3276* (2013.01); *H01L 51/5234* (2013.01); *H01L 2227/323* (2013.01)

(58) Field of Classification Search
CPC ............ H01L 51/5281; H01L 27/3276; H01L 51/5234; H01L 2227/323; H01L 27/326; H01L 27/3244
See application file for complete search history.

(56) References Cited

U.S. PATENT DOCUMENTS 8,860,915 B2 * 10/2014 Hwang ............... H01L 27/3276
                                                                    349/138
8,963,813 B2 *  2/2015 Kamatani ........... C07D 215/06
                                                                    345/76

(Continued)

*Primary Examiner* — Caleb E Henry (57) ABSTRACT

An organic light-emitting diode display panel and a display device are provided. By disposing the electrode layer in each light transmissive area within the electronic-component display area as the transparent electrode layer, external light passes through the transparent electrode layer to reach the electronic component located below the display screen, and the electronic-component display area can be displayed normally without removing the display material above the electronic component, that is, the boring is not required, thereby solving the defect that the prior art requires boring, and realizing the full-screen.

8 Claims, 7 Drawing Sheets

(56) References Cited

U.S. PATENT DOCUMENTS

| | | | |
|---|---|---|---|
| 8,969,857 B2* | 3/2015 | Kim | H01L 51/5281 |
| | | | 257/40 |
| 9,024,936 B2* | 5/2015 | Ogata | G09G 3/3225 |
| | | | 345/212 |
| 9,236,418 B2* | 1/2016 | Yamazaki | H01L 51/5253 |
| 9,240,569 B2* | 1/2016 | Fukuda | H01L 51/5281 |
| 9,590,153 B2* | 3/2017 | Takahashi | H01L 33/58 |
| 10,340,323 B2* | 7/2019 | Nie | H01L 27/3246 |
| 2009/0079336 A1* | 3/2009 | Yamada | H01L 51/5265 |
| | | | 313/504 |
| 2014/0197392 A1* | 7/2014 | Horiuchi | C07D 307/91 |
| | | | 257/40 |
| 2016/0079567 A1* | 3/2016 | Cho | H01L 51/5284 |
| | | | 257/40 |
| 2016/0112086 A1* | 4/2016 | Lei | H04M 1/0283 |
| | | | 455/566 |
| 2019/0305246 A1* | 10/2019 | Helander | H01L 51/0004 |

* cited by examiner

ORGANIC LIGHT-EMITTING DIODE DISPLAY PANEL HAVING UNDER-THE-SCREEN STRUCTURE AND DISPLAY DEVICE THEREOF

FIELD OF INVENTION

The present invention relates to the field of display technologies, and in particular to an organic light-emitting diode display panel and a display device.

BACKGROUND OF INVENTION

With development of comprehensive screen technology, technology of placing electronic components such as under-the-screen cameras under the display screen is a development trend.

A cathode structure of the existing OLED (Organic Light-Emitting Diode) display panel is a tiled display panel, and material thereof is a magnesium-silver alloy or a magnesium-silver laminated structure. Since silver has a large reflectance to light, loss is large when external light passes through the cathode structure. Therefore, in order to ensure lighting effect of the under-the-screen electronic components, such as the camera, the prior art needs to remove the display material (including a TFT circuit, a light-emitting layer, the cathode structure, etc.) above the camera, that is, boring technique. However, the boring area corresponding to this technique cannot be displayed because there is no substance displayed, and it is not a full-screen in a true sense.

Therefore, the prior art has defects and needs to be improved.

SUMMARY OF INVENTION

The present invention provides an organic light-emitting diode display panel and a display device for solving the technical problem of digging holes in the display screen existing in the prior art.

To solve the above problems, the technical solution provided by the present invention is as follows:

An embodiment of the present invention provides an organic light-emitting diode display panel, comprising an electronic-component display area corresponding to a position of an electronic component, the electronic-component display area including: a plurality of light transmissive areas; and an electrode layer located in each light-transmissive area, the electrode layer being a transparent conductive layer.

In the organic light-emitting diode display panel provided by the present invention, the electronic-component display area further includes: a pixel circuit area, disposed outside each of the light transmissive areas, including a circuit area corresponding to a driving-circuit disposition position of a pixel unit, and a signal-wiring area corresponding to a signal-wiring disposition position of a driving circuit.

In the organic light-emitting diode display panel provided by the present invention, an electrode layer located within the circuit area is a transparent conductive layer.

In the organic light-emitting diode display panel provided by the present invention, the electrode layer located within the circuit area is a magnesium-silver alloy layer or a magnesium-silver laminate.

In the organic light-emitting diode display panel provided by the present invention, the electrode layer located within the circuit area includes a transparent conductive layer and a magnesium-silver alloy layer, or a transparent conductive layer and a magnesium-silver laminate.

In the organic light-emitting diode display panel provided by the present invention, the transparent conductive layer is on luminescent-material layers, and the magnesium-silver alloy layer or the magnesium-silver laminate is on the transparent conductive layer.

In the organic light-emitting diode display panel provided by the present invention, an electrode layer located within the signal-wiring area is a transparent conductive layer.

In the organic light-emitting diode display panel provided by the present invention, an electrode layer located within the signal-wiring area is a magnesium-silver alloy layer or a magnesium-silver laminate.

In the organic light-emitting diode display panel provided by the present invention, an electrode layer located within the signal-wiring area includes a transparent conductive layer and a magnesium-silver alloy layer, or a transparent conductive layer and a magnesium-silver laminate.

In the organic light-emitting diode display panel provided by the present invention, the organic light-emitting diode display panel further includes a standard display area surrounding the electronic-component display area, and an electrode layer located within the standard display area includes a magnesium-silver alloy layer or a magnesium-silver laminate.

In the organic light-emitting diode display panel provided by the present invention, the electrode layer located within the standard display area further includes a transparent conductive layer.

An embodiment of the present invention further provides a display device, comprising an organic light-emitting diode display panel, the organic light-emitting diode display panel including an electronic-component display area corresponding to a position of an electronic component, the electronic-component display area including:

a plurality of light transmissive areas; and an electrode layer located in each light-transmissive area, the electrode layer being a transparent conductive layer.

In the display device of the present invention, the electronic-component display area further includes:

a pixel circuit area, disposed outside each of the light transmissive areas, including a circuit area corresponding to a driving-circuit disposition position of a pixel unit, and a signal-wiring area corresponding to a signal-wiring disposition position of a driving circuit.

In the display device of the present invention, an electrode layer located within the circuit area is a transparent conductive layer.

In the display device of the present invention, the electrode layer located within the circuit area is a magnesium-silver alloy layer or a magnesium-silver laminate.

In the display device of the present invention, the electrode layer located within the circuit area includes a transparent conductive layer and a magnesium-silver alloy layer, or a transparent conductive layer and a magnesium-silver laminate.

In the display device of the present invention, the transparent conductive layer is on luminescent-material layers, and the magnesium-silver alloy layer or the magnesium-silver laminate is on the transparent conductive layer.

In the display device of the present invention, an electrode layer located within the signal-wiring area is a transparent conductive layer.

In the display device of the present invention, the organic light-emitting diode display panel further includes a standard display area surrounding the electronic-component display area, and an electrode layer located within the standard display area includes a magnesium-silver alloy layer or a magnesium-silver laminate.

In the display device of the present invention, the electrode layer located within the standard display area further includes a transparent conductive layer.

The beneficial effects of the invention are as follows. The present invention provides an organic light-emitting diode display panel and a display device. The organic light-emitting diode display panel includes an electronic-component display area corresponding to a position of an electronic component. The electronic-component display area comprises light transmissive areas. An electrode layer located in each light transmissive area is a transparent conductive layer. By disposing the electrode layer in each light transmissive area within the electronic-component display area as the transparent electrode layer, external light passes through the transparent electrode layer to reach the electronic component located below the display screen, and the electronic-component display area can be displayed normally without removing the display material above the electronic component, that is, the boring is not required, thereby solving the defect that the prior art requires boring, and realizing the full-screen.

DESCRIPTION OF DRAWINGS

In order to more clearly illustrate the technical solutions in the embodiments of the present invention, the drawings used in the description of the embodiments will be briefly described below. It is obvious that the drawings in the following description are only some embodiments of the present invention. Other drawings can also be obtained from those skilled in the art based on these drawings without paying any creative effort.

DETAILED DESCRIPTION OF PREFERRED EMBODIMENTS

The following description of the embodiments is with reference to the drawings and is provided to illustrate the specific embodiments of the invention. The directional terms mentioned in the present invention, such as 'upper', 'lower', 'front', 'back', 'left', 'right', 'top', 'bottom', etc., are only the directions in the drawings. Therefore, the directional terminology used is for the purpose of illustration and understanding of the invention rather than limiting the invention. In the figures, structurally similar elements are denoted by the same reference numerals.

The present invention is directed to the technical problem of boring the display screen existing in the existing electronic component technology, and the embodiment of the present invention can solve the problem.

Figure 1:
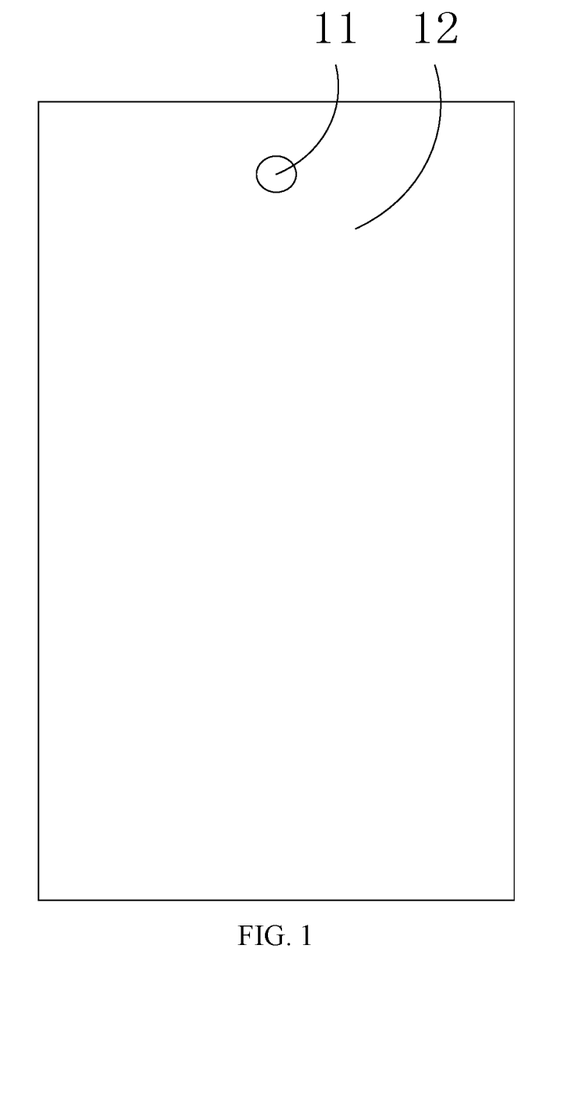
FIG. 1 is a schematic view of a conventional OLED display panel.

As shown in FIG. 1, the existing OLED (Organic Light-Emitting Diode) display has a camera disposed under the display screen, that is, the electronic component technology, and the cathode structure of the display panel is a full-surface magnesium-silver alloy or a magnesium-silver laminate. Since silver has a large reflectance to light, in order to make the camera have better lighting, display material of an electronic-component corresponding area 11 is generally excavated, that is, the boring technique. Thereby, only a standard display area 12 (i.e., all display areas except the electronic-component corresponding area 11) can be displayed, and the electronic-component corresponding area 11 cannot be displayed, which is not a full-screen in the true sense, that is, the existing electronic-component technology has defects and needs to be improved.

As shown in FIG. 2, FIG. 3, FIG. 4, FIG. 5, FIG. 6, and FIG. 7, an embodiment of the present invention provides an OLED display panel including an electronic-component display area 32 corresponding to a position of an electronic component, and the electronic-component display area 32 comprises:

a pixel circuit area 322, including a circuit area 3221 corresponding to a driving circuit of a pixel unit, and a signal-wiring area 3222 corresponding to signal wiring of a driving circuit; and a plurality of light transmissive areas 321, including parts of the electronic-component display area, which are outside the pixel circuit area 322;

wherein an electrode layer located in each light transmissive area 321 is a transparent conductive layer 2301, so that external light can pass through the light transmissive areas 321 to reach electronic components disposed under the screen, such as a camera, a light sensor, and the like. Thus the electronic components implement corresponding functions.

In one embodiment, the electrode layer is a cathode layer and an entire surface is laid over a pixel definition layer.

In one embodiment, an electrode layer located within the circuit area is a transparent conductive layer.

In one embodiment, the electrode layer located within the circuit area is a magnesium-silver alloy layer or a magnesium-silver laminate.

In one embodiment, the electrode layer located within the circuit area includes a transparent conductive layer and a magnesium-silver alloy layer, or a transparent conductive layer and a magnesium-silver laminate.

In one embodiment, the transparent conductive layer is on luminescent-material layers, and the magnesium-silver alloy layer or the magnesium-silver laminate is on the transparent conductive layer.

In one embodiment, an electrode layer located within the signal-wiring area is a transparent conductive layer.

In one embodiment, the electrode layer located within the signal-wiring area is a magnesium-silver alloy layer or a magnesium-silver laminate.

In one embodiment, the electrode layer located within the signal-wiring area includes a transparent conductive layer and a magnesium-silver alloy layer, or a transparent conductive layer and a magnesium-silver laminate.

In one embodiment, the organic light-emitting diode display panel further includes a standard display area surrounding the electronic-component display area (i.e., a display-area part in which all areas except the electronic-component display area are removed), and an electrode layer located within the standard display area includes a magnesium-silver alloy layer or a magnesium-silver laminate.

In one embodiment, the electrode layer located within the standard display area further includes a transparent conductive layer.

In one embodiment, the transparent conductive layer located in the electronic-component display area and the transparent conductive layer located in the standard display area are disposed in the same layer.

As shown in FIG. 2, FIG. 3, FIG. 4, FIG. 5, FIG. 6, and FIG. 7, the embodiment of the present invention provides an OLED display panel, which includes a substrate, a driving-circuit layer, a pixel definition layer, and a light-emitting layer. The substrate includes a substrate 111, a barrier layer 112, a first gate insulating layer 113, a second gate insulating layer 114, an interlayer insulating layer 115, a planarization layer 116, and a pixel definition layer 117. The driving-circuit layer includes active layers 120, sources 121, drains 122, first gates 123, and second gates 124. The light-emitting layer includes light-emitting units and an electrode layer, and each light-emitting unit includes an anode layer 210 and a luminescent-material layer 220.

Figure 2:
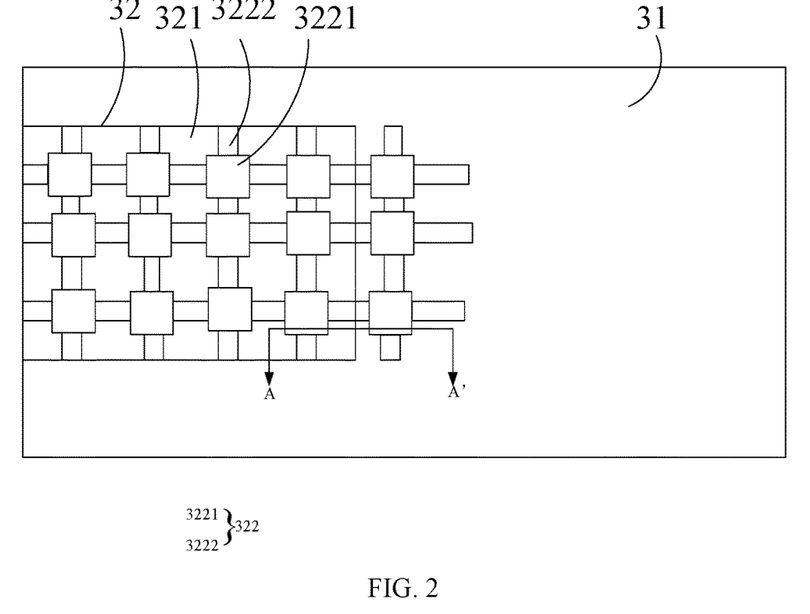
FIG. 2 is a first schematic view of an OLED according to an embodiment of the present invention.
Figure 3:
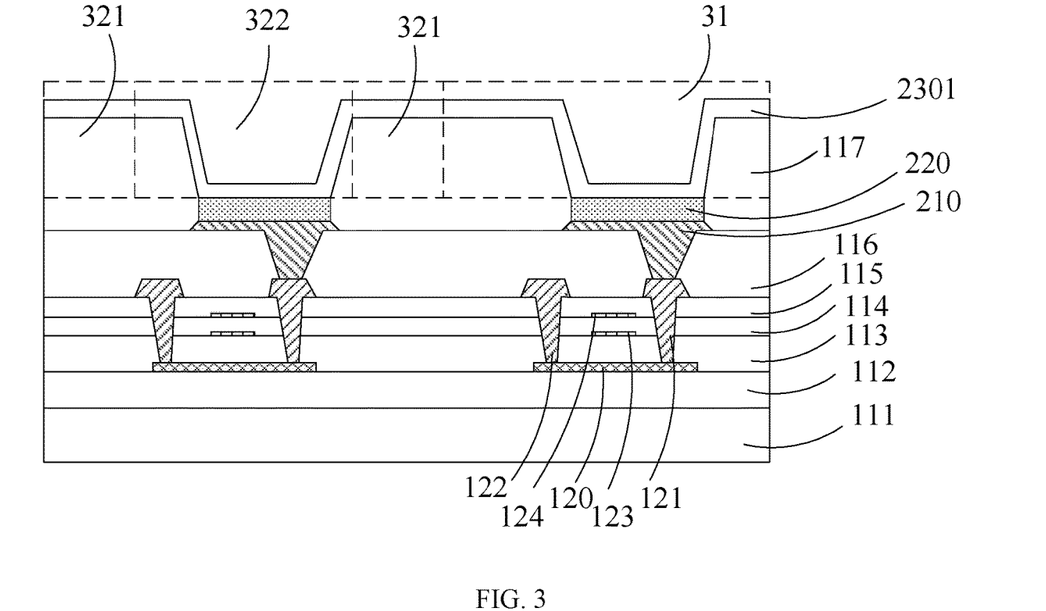
FIG. 3 is an AA' cross-sectional view of an OLED according to an embodiment of the present invention.

In one embodiment, as shown in FIG. 2 and FIG. 3, the electrode layer includes a transparent electrode layer 2301 disposed in the standard display area 31 and the electronic-component display area 32, the electronic-component display area 32 includes a plurality of light transmissive areas 321 and a pixel circuit area 322, and the pixel circuit area 322 includes a circuit area 3221 corresponding to a driving circuit of a pixel unit, and a signal-wiring area 3222 corresponding to signal wiring of a driving circuit.

In the embodiment of the present invention, the electrode layer is disposed as a transparent electrode layer, so that when the external light passes through the electrode layer while ensuring the normal display, the loss is small or there is no lost, and so that the electronic-component area does not need to be bored and can display normally, thus achieving a full-screen in the true sense. In the standard display area, since the electrode layer is a transparent electrode layer and all external light may affect display quality, the following embodiments are proposed.

Figure 4:
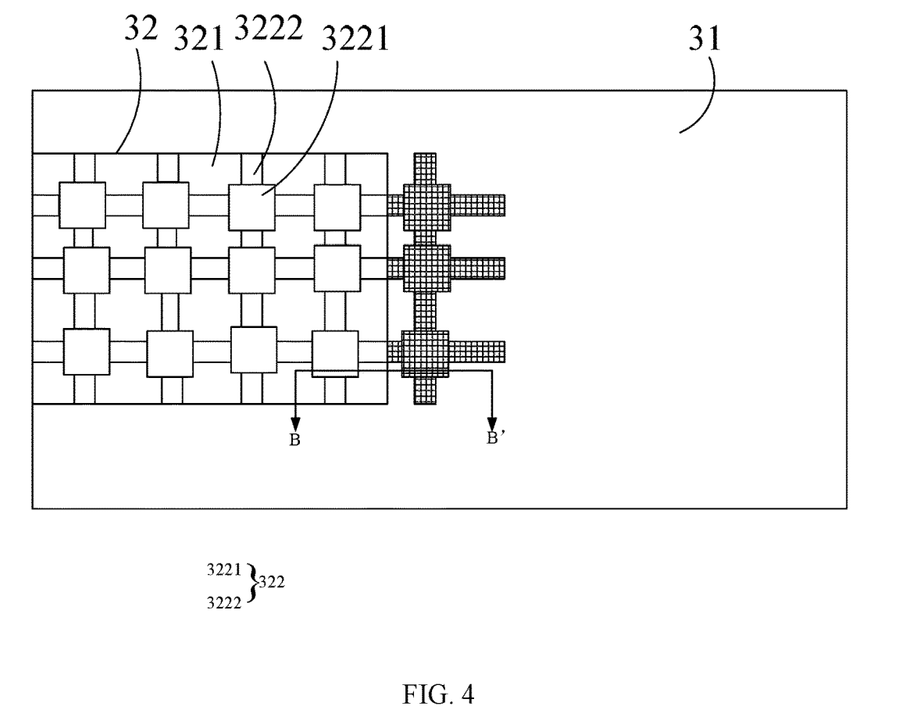
FIG. 4 is a second schematic view of an OLED according to an embodiment of the present invention.
Figure 5:
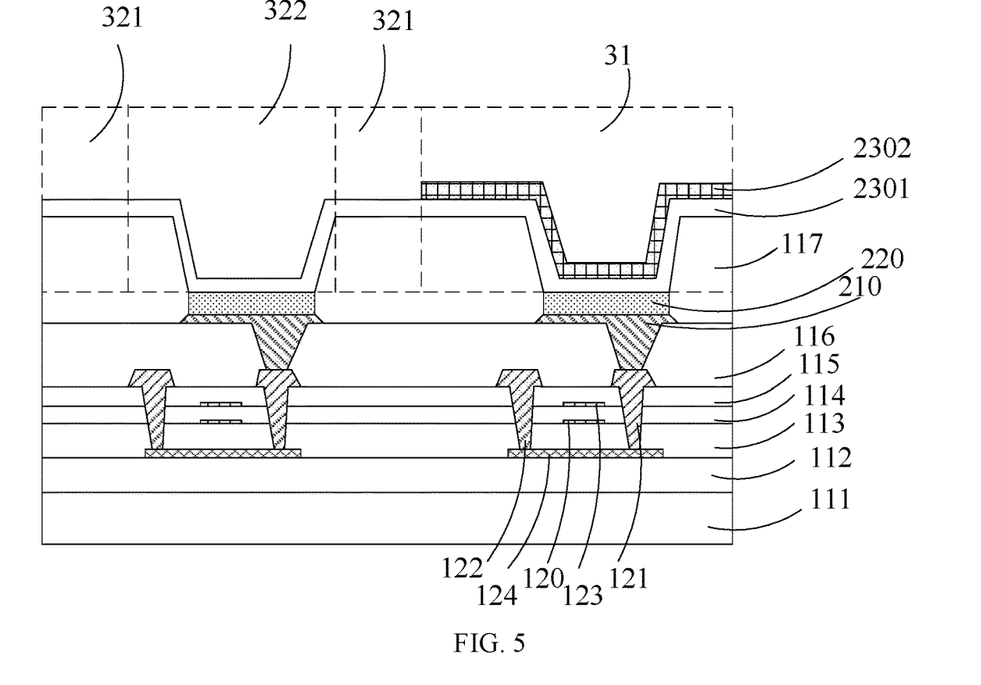
FIG. 5 is a BB' cross-sectional view of an OLED according to an embodiment of the present invention.

In one embodiment, as shown in FIG. 4 and FIG. 5, the electrode layer includes a transparent electrode layer 2301 disposed in the standard display area 31 and the electronic-component display area 32, and includes a magnesium-silver alloy layer 2302 disposed on the transparent electrode layer 2301 in the standard display area 31, the electronic-component display area 32 includes a plurality of light transmissive areas 321 and a pixel circuit area 322, and the pixel circuit area 322 includes a circuit area 3221 corresponding to a driving circuit of a pixel unit, and a signal-wiring area 3222 corresponding to signal wiring of a driving circuit.

In the embodiment of the present invention, the electrode layer is divided into two layers, the lower electrode layer is disposed as a transparent electrode layer, and then a magnesium-silver alloy layer is disposed on the transparent electrode layer of the standard display area, so that the light can better pass through the electronic-component display area, the area does not need to be bored, achieving a full-screen in the true sense, and at the same time, the technique makes it difficult for external light to enter the standard display area, making it difficult for external light to affect the display quality.

Figure 6:
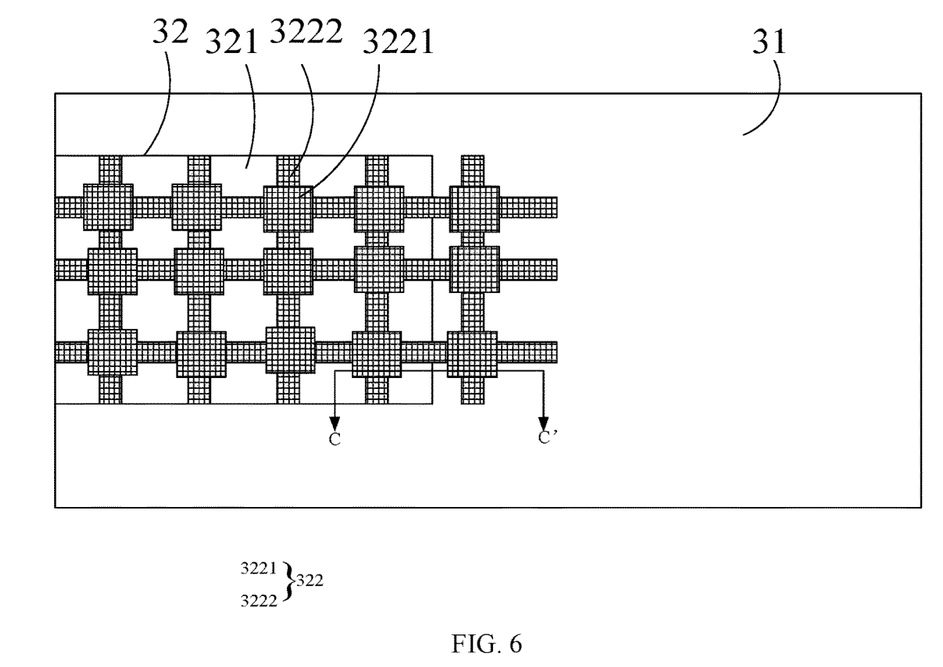
FIG. 6 is a third schematic view of an OLED according to an embodiment of the present invention.
Figure 7:
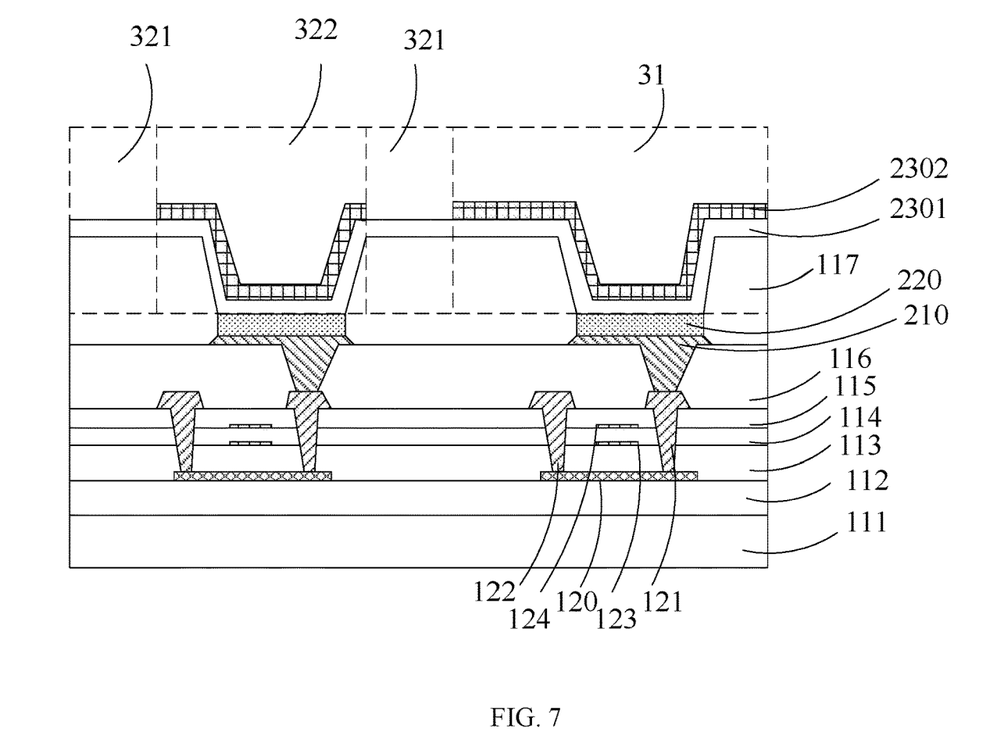
FIG. 7 is a CC' cross-sectional view of an OLED according to an embodiment of the present invention.

In one embodiment, as shown in FIG. 6 and FIG. 7, the electrode layer includes a transparent electrode layer 2301 disposed in the standard display area 31 and the electronic-component display area 32, the electronic-component display area includes a plurality of light transmissive areas 321 and a pixel circuit area 322, the electrode layer further includes a magnesium-silver alloy layer 2302 disposed on the transparent electrode layer 2301 in the standard display area 31 and the pixel circuit area 322, and the pixel circuit area 322 includes a circuit area 3221 corresponding to a driving circuit of a pixel unit, and a signal-wiring area 3222 corresponding to signal wiring of a driving circuit.

In the embodiment of the present invention, the electrode layer is divided into two layers, the lower electrode layer is disposed as a transparent electrode layer, and then a magnesium-silver alloy layer is disposed on the transparent electrode layer of the standard display area and the pixel circuit area, so that the light can better pass through the electronic-component display area, the area does not need to be bored, achieving a full-screen in the true sense, and the technique further prevents external light from entering non-light-transmissive areas, making it difficult for external light to affect the display quality.

In one embodiment, the electrode layer in each light transmissive area is a transparent conductive layer, the electrode layer in the circuit area is a transparent conductive layer, the electrode layer in the signal-wiring area is either a transparent conductive layer and a magnesium-silver alloy layer or a transparent conductive layer and a magnesium-silver laminate, and the electrode layer in the standard display area is either a transparent conductive layer and a magnesium-silver alloy layer or a transparent conductive layer and a magnesium-silver laminate.

In one embodiment, the electrode layer in each light transmissive area is a transparent conductive layer, the electrode layer in the circuit area is a magnesium-silver alloy layer or a magnesium-silver laminate, the electrode layer in the signal-wiring area is either a transparent conductive layer and a magnesium-silver alloy layer or a transparent conductive layer and a magnesium-silver laminate, and the electrode layer in the standard display area is either a transparent conductive layer and a magnesium-silver alloy layer or a transparent conductive layer and a magnesium-silver laminate.

In one embodiment, the electrode layer in each light transmissive area is a transparent conductive layer, the electrode layer in the circuit area is either a transparent conductive layer and a magnesium-silver alloy layer or a transparent conductive layer and a magnesium-silver laminate, the electrode layer in the signal-wiring area is either a transparent conductive layer and a magnesium-silver alloy layer or a transparent conductive layer and a magnesium-silver laminate, and the electrode layer in the standard display area is either a transparent conductive layer and a magnesium-silver alloy layer or a transparent conductive layer and a magnesium-silver laminate.

In one embodiment, the electrode layer in each light transmissive area is a transparent conductive layer, the electrode layer in the circuit area is either a transparent conductive layer and a magnesium-silver alloy layer or a transparent conductive layer and a magnesium-silver laminate, the electrode layer in the signal-wiring area is a transparent conductive layer, and the electrode layer in the standard display area is either a transparent conductive layer and a magnesium-silver alloy layer or a transparent conductive layer and a magnesium-silver laminate.

In one embodiment, the electrode layer in each light transmissive area is a transparent conductive layer, the electrode layer in the circuit area is either a transparent conductive layer and a magnesium-silver alloy layer or a transparent conductive layer and a magnesium-silver laminate, the electrode layer in the signal-wiring area is a magnesium-silver alloy layer or a magnesium-silver laminate, and the electrode layer in the standard display area is either a transparent conductive layer and a magnesium-silver alloy layer or a transparent conductive layer and a magnesium-silver laminate.

In one embodiment, the electrode layer in each light transmissive area is a transparent conductive layer, the electrode layer in the circuit area is either a transparent conductive layer and a magnesium-silver alloy layer or a transparent conductive layer and a magnesium-silver laminate, the electrode layer in the signal-wiring area is a magnesium-silver alloy layer or a magnesium-silver laminate, and the electrode layer in the standard display area is a magnesium-silver alloy layer or a magnesium-silver laminate.

In the embodiment of the present invention, the electrode layer in each light transmissive area is a transparent electrode layer, to cause that the external light can better pass through the electronic-component display area, the loss is small, and the boring is not required, thereby achieving the full-screen in the true sense. Besides, a magnesium-silver alloy layer or a magnesium-silver laminate is disposed on the transparent electrode layer of at least one of the standard display area, the circuit area, and the signal-wiring area, or the electrode layer in at least one of the standard display area, the circuit area, and the signal-wiring area is made be a magnesium-silver alloy layer or a magnesium-silver laminate. Different ways of disposition will prevent light from entering the non-light-transmissive area to a different extent, thus improving display quality.

In one embodiment, the substrate may be a flexible substrate, and may be formed from a plastic having good heat resistance and durability such as polyimine, polyethylene terephthalate, polycarbonate, polyethylene naphthalate, polyarylate, polyether phthalimide, etc.; the substrate may also be formed from various other suitable materials such as metals, glasses, and the like.

In one embodiment, the barrier layer is an inorganic material for preventing water vapor intrusion and ion implantation, and the barrier-layer material is tantalum nitride, lanthanum oxynitride, lanthanum oxide, lanthanum oxynitride, zinc oxide, or aluminum oxide. However, the embodiment of the present invention is not limited thereto.

In one embodiment, the gate insulating layer is used to insulate the active layer and the gates, the gate insulating layer may be an organic material or an inorganic material, and the inorganic material includes tantalum nitride or tantalum oxide, but the embodiment of the present invention is not limited to this. Besides, the first gate layer and the second gate layer may be made of the same material or made of different materials; for example, the first gate layer is made of an organic material, and the second gate layer is made of an inorganic material.

In one embodiment, the planarization layer is used to remove unevenness of the substrate, the pixel definition layer is used to define light-emitting areas, the material of the planarization layer may be the same as or different from that of the pixel definition layer, and the material includes polyacrylates, polycarbonates or polystyrene, but the invention is not limited thereto.

In an embodiment, the active layer may include a source area, a drain area and a channel area, and the active layer may be formed of an inorganic semiconductor such as an amorphous germanium or a polysilicon, an organic semiconductor, or an oxide semiconductor.

In one embodiment, the gate electrodes may be formed on the gate insulating layer, and the gate material may be gold, silver, copper, nickel, platinum, palladium, aluminum, molybdenum or alloy such as aluminum-bismuth alloy or molybdenum-tungsten alloy, but the invention embodiment is not limited to this. Besides, the first gate and the second gate may be formed with different materials; for example, the first gate is silver and the second gate is aluminum.

In one embodiment, each luminescent-material layer includes a hole injection layer, a hole transport layer, an exciton composite layer, an electron transport layer, and an electron injection layer.

In an embodiment, an embodiment of the present invention provides a display device including an organic light-emitting diode display panel, the organic light-emitting diode display panel including an electronic-component display area corresponding to a position of an electronic component, the electronic-component display area including:

a plurality of light transmissive areas; and an electrode layer located in each light-transmissive area, the electrode layer being a transparent conductive layer.

In an embodiment, in the display device of the present invention, the electronic-component display area further includes:

a pixel circuit area, disposed outside each of the light transmissive areas, including a circuit area corresponding to a driving-circuit disposition position of a pixel unit, and a signal-wiring area corresponding to a signal-wiring disposition position of a driving circuit.

In one embodiment, in the display device of the present invention, an electrode layer located within the circuit area is a transparent conductive layer.

In one embodiment, in the display device of the present invention, the electrode layer located within the circuit area is a magnesium-silver alloy layer or a magnesium-silver laminate.

In one embodiment, in the display device of the present invention, the electrode layer located within the circuit area includes a transparent conductive layer and a magnesium-silver alloy layer, or a transparent conductive layer and a magnesium-silver laminate.

In one embodiment, in the display device of the present invention, the transparent conductive layer is on luminescent-material layers, and the magnesium-silver alloy layer or the magnesium-silver laminate is on the transparent conductive layer.

In one embodiment, in the display device of the present invention, an electrode layer located within the signal-wiring area is a transparent conductive layer.

In one embodiment, in the display device of the present invention, the organic light-emitting diode display panel further includes a standard display area surrounding the electronic-component display area, and an electrode layer located within the standard display area includes a magnesium-silver alloy layer or a magnesium-silver laminate.

In one embodiment, in the display device of the present invention, the electrode layer located within the standard display area further includes a transparent conductive layer.

The embodiment of the present invention provides an OLED display device, which includes an OLED display panel and a camera. The OLED display panel can be any one of the above embodiments, and the camera is disposed under the OLED display panel. By disposing the pixel circuit area and the light transmissive areas in the electronic-component display area of the display panel corresponding to the camera, and controlling the electrode layer within each light transmissive area to be a transparent conductive layer, the loss is small or there's even no loss when the external light passes through the electrode layer, so that the electronic-component display area does not need to be bored, so as to achieve a full-screen display and achieve that the camera can have better lighting, showing a complete and clear image.

Figure 8:
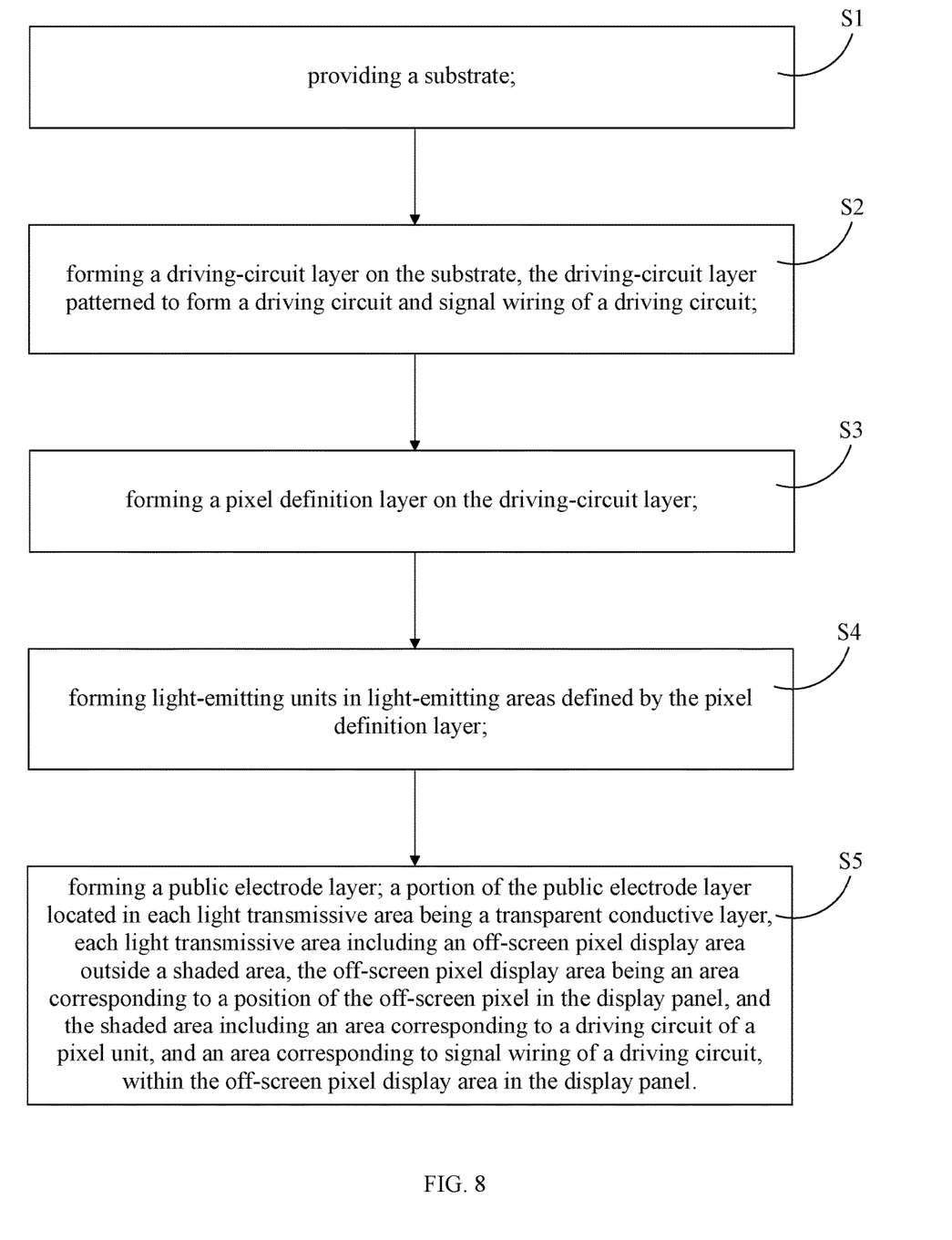
FIG. 8 is a flow chart of preparing an OLED according to an embodiment of the present invention.

As shown in FIG. 8, an embodiment of the present invention provides a method for fabricating an OLED display panel, including:

step S1, providing a substrate;

step S2, forming a driving-circuit layer on the substrate, the driving-circuit layer patterned to form a driving circuit and signal wiring of a driving circuit;

step S3, forming a pixel definition layer on the driving-circuit layer;

step S4, forming light-emitting units in light-emitting areas defined by the pixel definition layer; and step S5, forming an electrode layer; a portion of the electrode layer located in each light transmissive area being a transparent conductive layer, each light transmissive area including an electronic-component display area outside a pixel circuit area, the electronic-component display area being an area corresponding to a position of the electronic component in the display panel, and the pixel circuit area including an area corresponding to a driving circuit of a pixel unit, and an area corresponding to signal wiring of a driving circuit, within the electronic-component display area in the display panel.

In one embodiment, the step of forming the electrode layer includes: forming a transparent conductive layer tiling the display panel; forming a magnesium-silver alloy layer or a magnesium-silver laminate on which the display panel is tiled on the transparent conductive layer; and removing a magnesium-silver alloy layer or a magnesium-silver laminate in each light-transmissive area.

Figure 9:
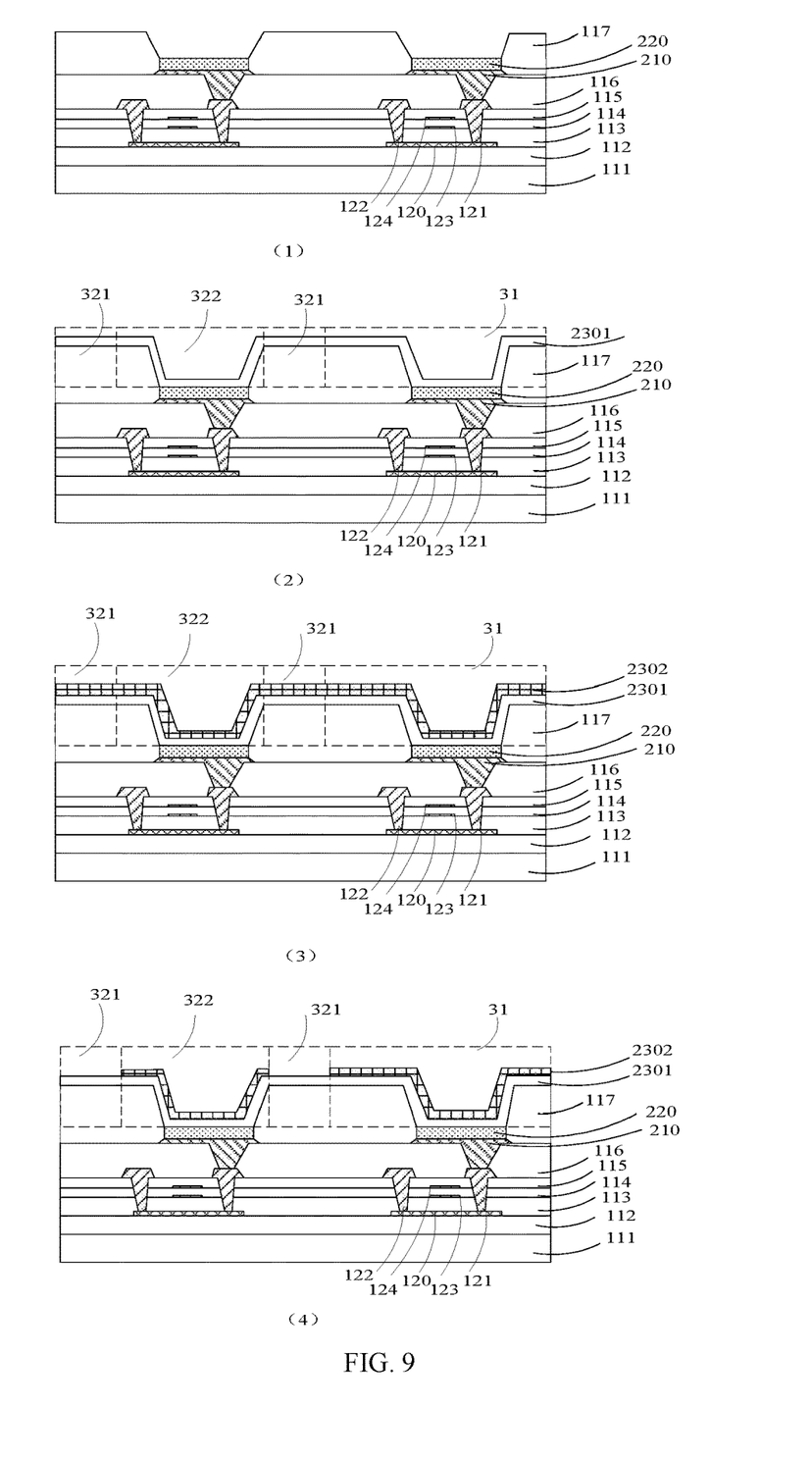
FIG. 9 is a first schematic view of preparation of an OLED according to an embodiment of the present invention.

As shown in FIG. 9, an embodiment of the present invention provides a method for fabricating an OLED display panel, including:

step 91, preparing a substrate, the step 61 including providing a substrate 111, forming a barrier layer 112 on the substrate 111, forming active layers 120 on the barrier layer 112, forming a first gate insulating layer 113 on the active layers 120, forming first gate electrodes 123 on the first gate insulating layer 113, forming a second gate insulating layer 114 on the first gate electrodes 123, forming second gates 124 on the second gate insulating layer 114, forming an interlayer insulating layer 115 on the second gates 124, disposing via holes between the first gate insulating layer 113, the second gate insulating layer 114, and the interlayer insulating layer, forming a source 121 and a drain 122 in the corresponding via holes, respectively, forming a planarization layer 116 on the sources 121 and drains 122, forming a pixel definition layer 118 on the planarization layer 116, forming a anode layer 210 in each light-emitting area defined by the pixel definition layer 118, and forming a luminescent-material layer 220 in each anode layer 210, and the effect being as shown in (1) of FIG. 6;

step 92, forming a transparent electrode layer 2301 on the luminescent-material layers 220, the effect being as shown in (2) of FIG. 6;

step 93, forming a magnesium-silver alloy layer 2302 on the transparent electrode layer 2301, the magnesium-silver alloy layer disposed in a standard display area 31, light transmissive areas 321 and a pixel circuit area 322, and the effect as shown in (3) of FIG. 6; and step 94, removing the magnesium-silver alloy layer of the light transmissive areas 321, the effect being as shown in (4) of FIG. 6.

Figure 10:
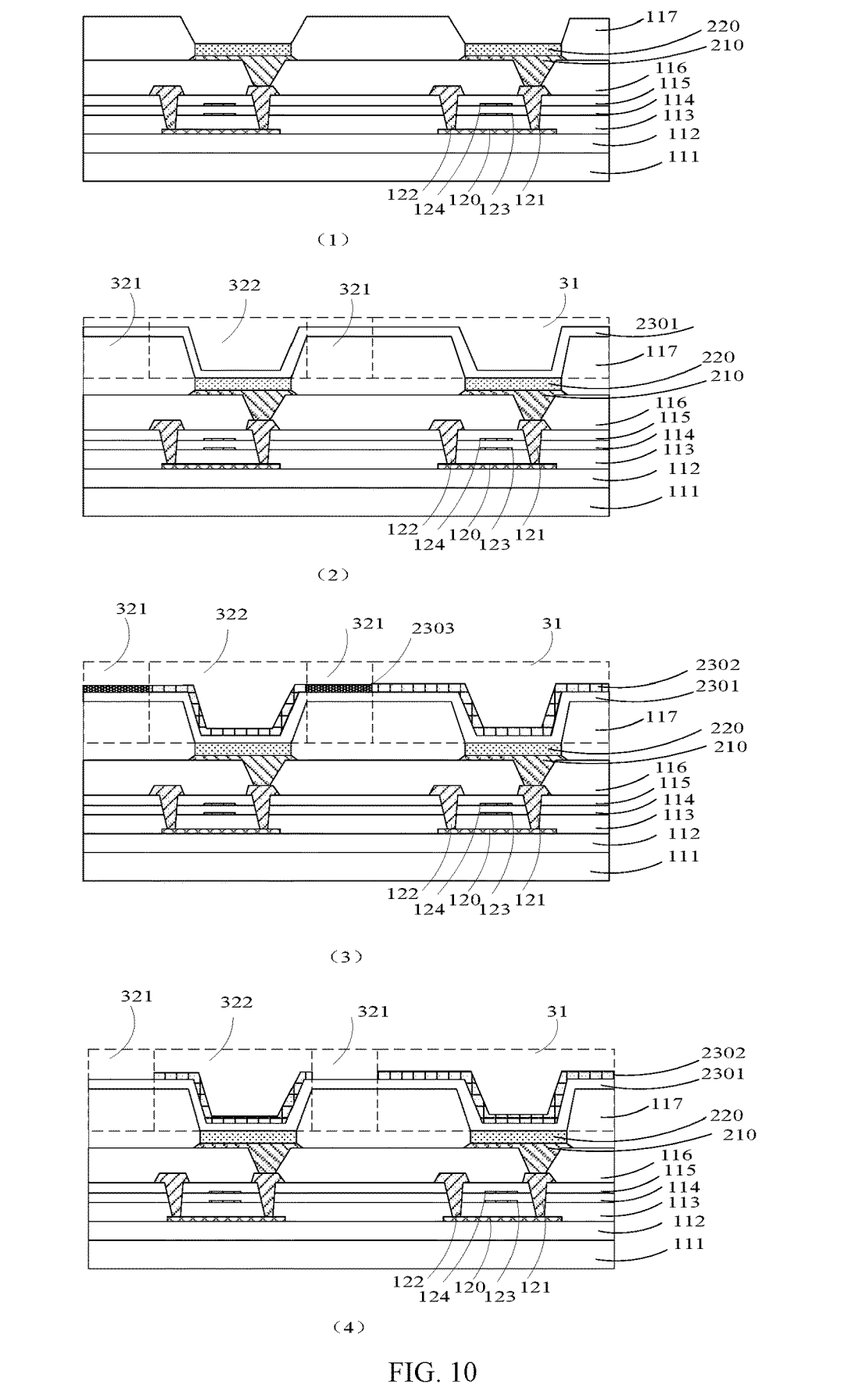
FIG. 10 is a second schematic view of preparation of an OLED according to an embodiment of the present invention.

As shown in FIG. 10, an embodiment of the present invention provides a method for fabricating an OLED display panel, including:

step 101, preparing a substrate, the step 71 including providing a substrate 111, forming a barrier layer 112 on the substrate 111, forming active layers 120 on the barrier layer 112, forming a first gate insulating layer 113 on the active layers 120, forming first gate electrodes 123 on the first gate insulating layer 113, forming a second gate insulating layer 114 on the first gate electrodes 123, forming second gates 124 on the second gate insulating layer 114, forming an interlayer insulating layer 115 on the second gates 124, disposing via holes between the first gate insulating layer 113, the second gate insulating layer 114, and the interlayer insulating layer, forming a source 121 and a drain 122 in the corresponding via holes, respectively, forming a planarization layer 116 on the sources 121 and drains 122, forming a pixel definition layer 118 on the planarization layer 116, forming a anode layer 210 in each light-emitting area defined by the pixel definition layer 118, and forming a luminescent-material layer 220 in each anode layer 210, and the effect being as shown in (1) of FIG. 7;

step 102, forming a transparent electrode layer 2301 on the luminescent-material layers 220, the effect being as shown in (2) of FIG. 7;

step 103, forming magnesium-silver alloy layers 2302 and shadowless adhesive layers 2303 on the transparent electrode layer 2301, the magnesium-silver alloy layers 2302 formed in a standard display area 31 and a pixel circuit area 322, the shadowless adhesive layers 2303 formed in light transmissive areas 321, and the effect as shown in (3) of FIG. 7; and step 104, removing the shadowless adhesive layers 2303 of the light transmissive areas 321, the effect being as shown in (4) of FIG. 7.

In one embodiment, material of the transparent electrode layer may be a metal oxide such as titanium oxide, indium tin oxide, zinc oxide, and magnesium oxide, or may be graphene or carbon nanotubes. This embodiment selects material having a low work function, ensuring efficiency of electron injection.

In one embodiment, a coverage area of the transparent electrode layer is not less than areas of the luminescent-material layers, and the coverage area of the transparent electrode layer is not greater than anode coverage layers, so that thickness of the transparent electrode layer is 5 nm-100 nm. In this embodiment, the thickness of the transparent electrode layer is selected to be 15 nm, so that the transparent electrode layer has better light-emitting efficiency and can effectively protect the luminescent-material layers.

In one embodiment, the thickness of the magnesium-silver alloy layer or the magnesium-silver laminate is 5 nm-300 nm. In this embodiment, 140 nm is selected to provide better light-emitting efficiency.

In one embodiment, manners of removing the magnesium-silver alloy layer or the magnesium-silver laminate include plasma bombardment, wet etching, laser cutting, and the like under vacuum. But the embodiment of the present invention is not limited thereto.

In one embodiment, the transparent electrode layer may be formed in the light-transmissive areas, the magnesium-silver alloy layer or the magnesium-silver laminate may be disposed in the pixel circuit area, and the magnesium-silver alloy layer or the magnesium-silver laminate may be formed in the standard display area, It is not necessary to form the transparent electrode layer in the pixel circuit area and the standard display area first. The desired display panel can be directly obtained.

In one embodiment, in order to reduce difficulty of the process, the transparent electrode layer is formed in the electronic-component display area, and the magnesium-silver alloy layer or the magnesium-silver laminate is formed in the standard display area. It is not necessary to form the transparent electrode layer in the standard display area. The desired display panel can be directly obtained.

According to the above embodiments, it can be known that:

Embodiments of the present invention provide an organic light-emitting diode display panel, a fabrication method thereof, and a display device. The organic light-emitting diode display panel includes an electronic-component display area corresponding to a position of an electronic component. The electronic-component display area comprises a pixel circuit area and a plurality of light transmissive areas. The pixel circuit area includes a circuit area corresponding to a driving circuit of a pixel unit, and a signal-wiring area corresponding to signal wiring of a driving circuit. The light transmissive areas include parts of the electronic-component display area, which are outside the pixel circuit area. An electrode layer located in each light transmissive area is a transparent conductive layer. By disposing the electrode layer of each light transmissive area as the transparent electrode layer, the electronic-component display area can be displayed normally without removing the display material, that is, the boring is not required, thereby solving the defects of the existing electronic-component technology and realizing the full-screen. In the embodiment of the present invention, the electrode layer of each light transmissive area is disposed as the transparent electrode layer, then the transparent electrode layer is disposed in the pixel circuit area, and then the transparent electrode layer is disposed in the standard display area, so that the external light energy can better pass through the electronic-component display area and the boring is not required, thereby achieving a full-screen in the true sense. Further, in order to prevent the external light from affecting the emitted light, the embodiment of the present invention provides a magnesium-silver alloy layer or a magnesium-silver laminate on the transparent electrode layer of the standard display area, so that the external light is reflected when passing through the standard display area, and does not affect the emitted light. Further, in order to prevent the external light from affecting the emitted light, the embodiment of the present invention provides a magnesium-silver alloy layer or a magnesium-silver laminate on the transparent electrode layer of the circuit area and the signal-wiring area, so that the external light is reflected when passing through the pixel circuit area, and does not affect the emitted light. By preparing a transparent electrode layer on the light-emitting layer, then preparing a magnesium-silver alloy layer or a magnesium-silver laminate on the transparent electrode layer, and then removing the magnesium-silver alloy layer or the magnesium-silver laminate on the light transmissive areas, the transparent electrode layer is thereby not damaged in the preparation process. The material of the transparent electrode layer is selected from materials having low work function, so that it has good display performance. The thickness of the transparent electrode layer is controlled to protect the luminescent-material layers while having good light-emitting efficiency.

In the above, although the present invention has been disclosed in the above preferred embodiments, the above-described preferred embodiments are not intended to limit the invention, and those skilled in the art can make various changes and retouches without departing from the spirit and scope of the present invention. The scope of protection of the present invention is determined by the scope defined by the claims.

What is claimed is:

1. An organic light-emitting diode display panel, comprising an electronic-component display area corresponding to a position of an electronic component and a standard display area surrounding the electronic-component display area, and an electrode layer located within the standard display area includes a transparent conductive layer and a magnesium-silver alloy layer, or a transparent conductive layer and a magnesium-silver laminate, wherein the electronic-component display area comprises:
   a plurality of light transmissive areas;
   an electrode layer located in each of the light transmissive areas, the electrode layer being a transparent conductive layer; and
   a pixel circuit area, disposed outside each of the light transmissive areas, including a circuit area corresponding to a driving-circuit disposition position of a pixel unit, and a signal-wiring area corresponding to a signal-wiring disposition position of a driving circuit,
   wherein an electrode layer located within the circuit area and includes a transparent conductive layer and a magnesium-silver alloy layer, or a transparent conductive layer and a magnesium-silver laminate.

2. The organic light-emitting diode display panel as claimed in claim 1, wherein the transparent conductive layer located in each of the light transmissive areas is disposed on luminescent-material layers, and the magnesium-silver alloy layer or the magnesium-silver laminate located within the circuit area is further extended and disposed on the transparent conductive layer located in each of the light transmissive areas.

3. The organic light-emitting diode display panel as claimed in claim 1, wherein an electrode layer located within the signal-wiring area is a transparent conductive layer.

4. The organic light-emitting diode display panel as claimed in claim 1, wherein an electrode layer located within the signal-wiring area is a magnesium-silver alloy layer or a magnesium-silver laminate.

5. The organic light-emitting diode display panel as claimed in claim 1, wherein an electrode layer located within the signal-wiring area includes a transparent conductive layer and a magnesium-silver alloy layer, or a transparent conductive layer and a magnesium-silver laminate.

6. A display device, comprising an organic light-emitting diode display panel, the organic light-emitting diode display panel including an electronic-component display area corresponding to a position of an electronic component and a standard display area surrounding the electronic-component display area, and an electrode layer located within the standard display area includes a transparent conductive layer and a magnesium-silver alloy layer, or a transparent conductive layer and a magnesium-silver laminate, wherein the electronic-component display area comprises:
   a plurality of light transmissive areas;

an electrode layer located in each light transmissive area, the electrode layer being a transparent conductive layer; and a pixel circuit area, disposed outside each of the light transmissive areas, including a circuit area corresponding to a driving-circuit disposition position of a pixel unit, and a signal-wiring area corresponding to a signal-wiring disposition position of a driving circuit, wherein an electrode layer located within the circuit area and includes a transparent conductive layer and a magnesium-silver alloy layer, or a transparent conductive layer and a magnesium-silver laminate.

7. The display device as claimed in claim 6, wherein the transparent conductive layer located in each of the light transmissive areas is disposed on luminescent-material layers, and the magnesium-silver alloy layer or the magnesium-silver laminate is further extended and disposed on the transparent conductive layer located in each of the light transmissive areas.

8. The display device as claimed in claim 6, wherein an electrode layer located within the signal-wiring area is a transparent conductive layer.

* * * * *

UNITED STATES PATENT AND TRADEMARK OFFICE
CERTIFICATE OF CORRECTION

PATENT NO. : 10,937,993 B2
APPLICATION NO. : 16/472997
DATED : March 2, 2021
INVENTOR(S) : Rui Tang and Wenzhi Zhang

It is certified that error appears in the above-identified patent and that said Letters Patent is hereby corrected as shown below:

On the Title Page

Item (73) Assignee:
WUHAN CHINA STAR OPTOELECTRONICS SEMICONDUCTOR DISPLAY CO., LTD., Wuhan (CN)

Is changed to:
WUHAN CHINA STAR OPTOELECTRONICS SEMICONDUCTOR DISPLAY TECHNOLOGY CO., LTD., Wuhan (CN)

Signed and Sealed this
Twelfth Day of July, 2022

Katherine Kelly Vidal
*Director of the United States Patent and Trademark Office*